United States Patent
Chuang et al.

(10) Patent No.: US 11,894,448 B2
(45) Date of Patent: *Feb. 6, 2024

(54) STRUCTURE AND METHOD FOR VERTICAL TUNNELING FIELD EFFECT TRANSISTOR WITH LEVELED SOURCE AND DRAIN

(71) Applicant: Taiwan Semiconductor Manufacturing Company, Ltd., Hsinchu (TW)

(72) Inventors: Harry-Hak-Lay Chuang, Singapore (SG); Yi-Ren Chen, Taoyuan County (TW); Chi-Wen Liu, Hsin-Chu (TW); Chao-Hsiung Wang, Hsin-Chu (TW); Ming Zhu, Singapore (SG)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 105 days.

This patent is subject to a terminal disclaimer.

(21) Appl. No.: 17/406,861

(22) Filed: Aug. 19, 2021

(65) Prior Publication Data

US 2021/0384327 A1 Dec. 9, 2021

Related U.S. Application Data

(60) Continuation of application No. 16/160,308, filed on Oct. 15, 2018, now Pat. No. 11,101,371, which is a
(Continued)

(51) Int. Cl.
*H01L 29/66* (2006.01)
*H01L 27/08* (2006.01)
(Continued)

(52) U.S. Cl.
CPC .......... *H01L 29/66977* (2013.01); *H01L 21/823487* (2013.01); *H01L 21/823885* (2013.01);
(Continued)

(58) Field of Classification Search
CPC ..... H01L 21/823487; H01L 21/823885; H01L 27/0802; H01L 27/092; H01L 28/20; H01L 29/66666; H01L 29/66977; H01L 29/785
See application file for complete search history.

(56) References Cited

U.S. PATENT DOCUMENTS 9,111,780 B2    8/2015   Chuang et al.
10,103,253 B2   10/2018   Chuang et al.
(Continued)

*Primary Examiner* — Marcos D. Pizarro
(74) *Attorney, Agent, or Firm* — HAYNES AND BOONE, LLP

(57) ABSTRACT

The present disclosure provides one embodiment of a semiconductor structure. The semiconductor structure includes a semiconductor substrate having a first region and a second region; a first semiconductor mesa formed on the semiconductor substrate within the first region; a second semiconductor mesa formed on the semiconductor substrate within the second region; and a field effect transistor (FET) formed on the semiconductor substrate. The FET includes a first doped feature of a first conductivity type formed in a top portion of the first semiconductor mesa; a second doped feature of a second conductivity type formed in a bottom portion of the first semiconductor mesa, the second semiconductor mesa, and a portion of the semiconductor substrate between the first and second semiconductor mesas; a channel in a middle portion of the first semiconductor mesa and interposed between the source and drain; and a gate formed on sidewall of the first semiconductor mesa.

20 Claims, 15 Drawing Sheets

Related U.S. Application Data continuation of application No. 14/827,464, filed on Aug. 17, 2015, now Pat. No. 10,103,253, which is a division of application No. 13/795,240, filed on Mar. 12, 2013, now Pat. No. 9,111,780.

(51) Int. Cl.
*H01L 21/8234* (2006.01)
*H01L 27/092* (2006.01)
*H01L 21/8238* (2006.01)
*H01L 29/78* (2006.01)
*H01L 49/02* (2006.01)

(52) U.S. Cl.
CPC ........ *H01L 27/0802* (2013.01); *H01L 27/092* (2013.01); *H01L 28/20* (2013.01); *H01L 29/66666* (2013.01); *H01L 29/785* (2013.01)

(56) References Cited

U.S. PATENT DOCUMENTS

| | | |
|---|---|---|
| 11,101,371 B2 * | 8/2021 | Chuang ............... H01L 29/7391 |
| 2007/0228491 A1 | 10/2007 | Forbes |
| 2009/0026556 A1 | 1/2009 | Otake |
| 2011/0084319 A1 * | 4/2011 | Zhu .................... H01L 29/7606 |
| | | 257/E21.409 |
| 2011/0253981 A1 | 10/2011 | Rooyackers et al. |
| 2012/0061766 A1 * | 3/2012 | Izumi ............. H01L 21/823871 |
| | | 257/E21.409 |
| 2014/0061775 A1 | 3/2014 | Chuang et al. |
| 2014/0264289 A1 | 9/2014 | Chuang et al. |
| 2015/0357445 A1 | 12/2015 | Chuang et al. |
| 2019/0097029 A1 | 3/2019 | Chuang et al. |

\* cited by examiner

STRUCTURE AND METHOD FOR VERTICAL TUNNELING FIELD EFFECT TRANSISTOR WITH LEVELED SOURCE AND DRAIN

PRIORITY DATA

The present application is a continuation application of U.S. application Ser. No. 16/160,308, filed Oct. 15, 2019, which is a continuation application of U.S. application Ser. No. 14/827,464, filed Aug. 17, 2015, which is a divisional application of U.S. application Ser. No. 13/795,240, filed Mar. 12, 2013, each of which is incorporated herein by reference in its entirety.

BACKGROUND

The scaling of conventional complementary metal-oxide-semiconductor field effect transistor (CMOSFET) faces challenges of rapid increase in power consumption. Tunnel field effect transistor (TFET) is a promising candidate enabling further scaling of power supply voltage without increase of off-state leakage current due to its sub-60 mV/dec subthreshold swing. However, in a vertical TFET, the source and drain are at different horizontal levels, which present various issues. For example, the contacts to the source and drain face more challenge due to the height difference.

Accordingly, there is a need for a structure having vertical TFET device and a method making the same to address above concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
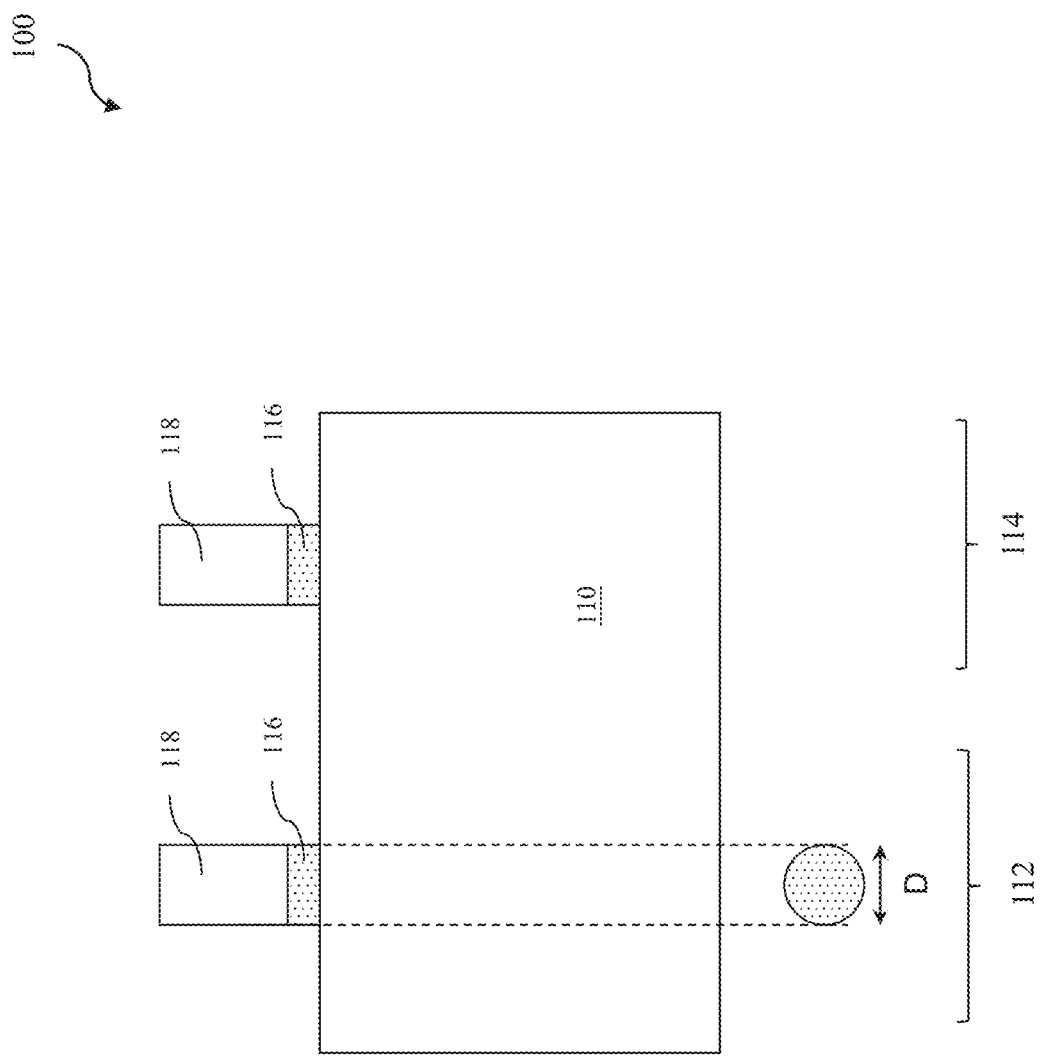
FIGS. 1-11 are sectional views of a semiconductor structure having a tunnel field effect transistor (TFET) structure at various fabrication stages constructed according to one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1-11 are sectional views of a semiconductor structure 100 at various fabrication stages constructed according to one or more embodiment. The semiconductor structure 100 includes one or more tunnel field effect transistor (TFET). In furtherance of the embodiment, the TFET has a vertical structure wherein the channel is vertically configured and interposed between the source and drain. FIG. 12 is a flowchart of a method 200 to form the semiconductor structure 100 constructed according to one or more embodiment. The semiconductor structure 100 and the method 200 making the same are collectively described with reference to FIGS. 1-12.

Referring to FIG. 1, the semiconductor structure 100 includes a semiconductor substrate 110 of a first semiconductor material. In the present embodiment, the first semiconductor material is silicon. Alternatively, the first semiconductor material may include other proper semiconductor material. In one embodiment, the semiconductor substrate 110 includes a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

The semiconductor substrate 110 includes a first region 112 and a second region 114. The semiconductor substrate 110 includes a tunnel field effect transistor (TFET) formed in the first second regions. In the present embodiment, the TFET is a vertical TFET where the channel of the TFET is along a direction perpendicular to the top surface of the semiconductor substrate 110.

Referring to FIGS. 1 and 12, the method 200 begins at operation 202 by forming a patterned hard mask 116 to define areas for a first semiconductor mesa on the semiconductor substrate 110 within the first region 112 and a second semiconductor mesa on the semiconductor substrate 110 within the first region 112. Specifically, the patterned hard mask 116 includes a first feature in the first region 112 and a second feature in the second region 114. Each feature has a geometry defining the geometry of the corresponding semiconductor mesa. In the present embodiment, each feature of the patterned hard mask 116 has a round shape with a diameter D, which depends on the designed size of the corresponding semiconductor mesa and further depends on the fabrication bias. In one example, the diameter D ranges between about 10 nm and about 50 nm.

The patterned hard mask 116 includes a dielectric material with etch selectivity to the semiconductor substrate 110. In the present embodiment, the patterned hard mask 116 includes silicon nitride (SiN). In other embodiments, the patterned hard mask 116 alternatively includes other suitable material, such as silicon oxynitride or silicon carbide.

In one embodiment, the patterned hard mask 116 is formed by a procedure including deposition, lithography process and etching. In furtherance of the embodiment, the formation of the patterned hard mask 116 includes depositing a hard mask layer by a suitable technique, such as chemical vapor deposition (CVD); forming a patterned photoresist layer 118 on the hard mask layer using a lithography process; etching the hard mask layer to form the patterned hard mask 116 using the patterned photoresist layer 118 as an etch mask; and thereafter removing the patterned photoresist layer 118 by a suitable technique, such as wet stripping or plasma ashing. In one embodiment, the lithography process includes forming a photoresist layer by spin-on coating; exposing the photoresist layer using an exposure energy, such as ultraviolet (UV) light, and developing the exposed photoresist layer to form the patterned photoresist layer using a developing chemical. In another example, the lithography process includes spin-on coating, soft baking, exposing, post-exposure baking, developing and hard baking. In other embodiment, the lithography process to form the patterned photoresist layer 118 may alternatively use other technique, such as e-beam lithography, maskless patterning or molecular print.

Figure 2:
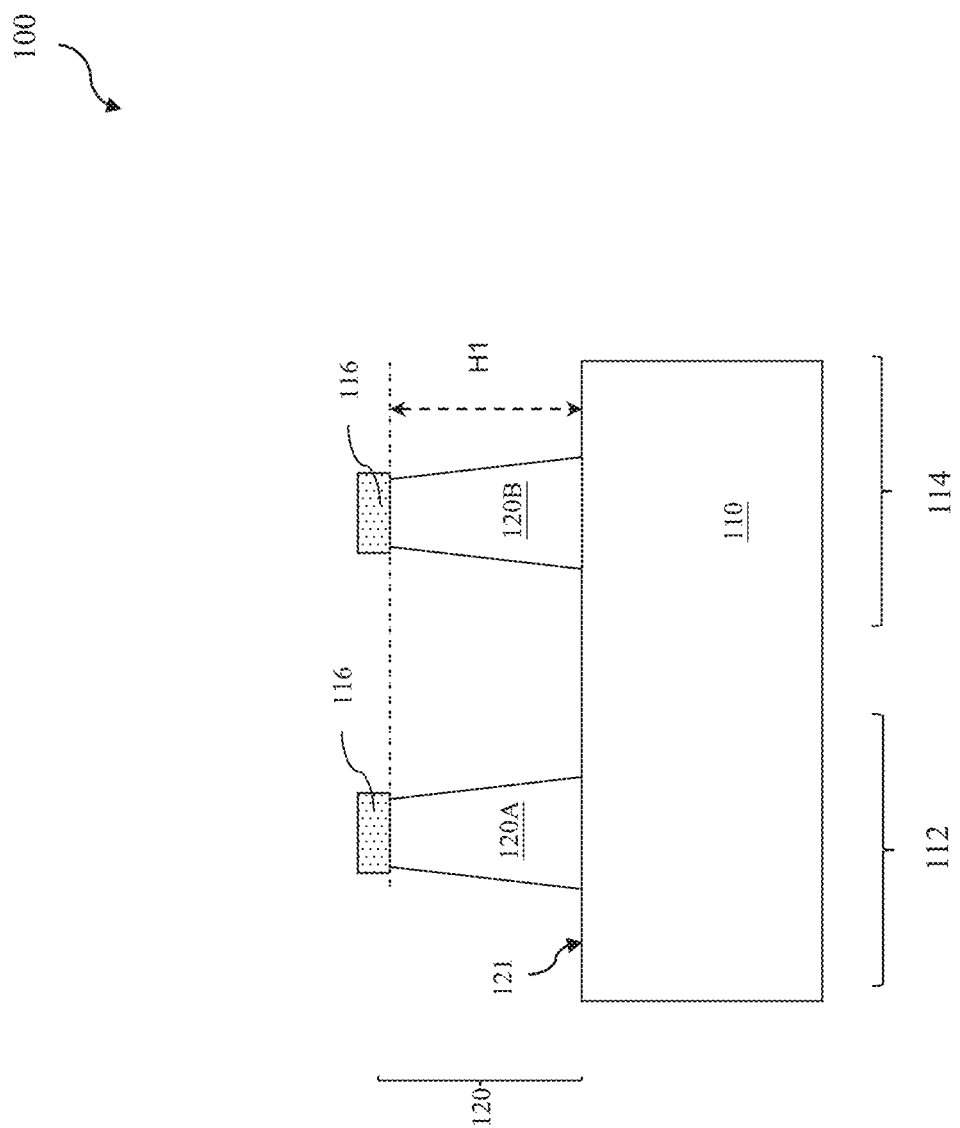

Referring to FIGS. 2 and 12, the method 200 includes an operation 204 by selectively recessing the semiconductor substrate to form semiconductor mesas 120, especially the first semiconductor mesa 120A in the first region 112 and the second semiconductor mesa 120B in the second region 114.

In the present embodiment, the first and second semiconductor mesas have a coplanar top surface. The semiconductor mesas (120A and 120B) have a height "H1" as a vertical dimension relative to the top surface 121 of the semiconductor substrate 110. In one example, the recess depth ranges between about 50 nm and about 200 nm. Therefore, the height H1 of the semiconductor mesas 120 is in the same range for this example.

The first and second semiconductor mesas are simultaneously formed in a same procedure. In the present embodiment, an etch process is applied to selectively etch the semiconductor substrate 116 using the patterned hard mask 116 as an etch mask. For example, the etch process includes a dry etch to etch silicon of the semiconductor substrate 110. In one embodiment, the etch process is tuned to form the semiconductor mesa 120A (120B as well) having a sidewall profile in a trapezoidal shape. Particularly, the sidewall profile of the each semiconductor mesa has a tilting angle less than 90° and greater than 45°, where the tilting angle is measured relative to the top surface 121 of the semiconductor substrate 110. Thus formed the semiconductor mesa (120A or 120B) has a better fabrication benefits during the subsequent process steps, such as deposition and/or etch.

Figure 3:
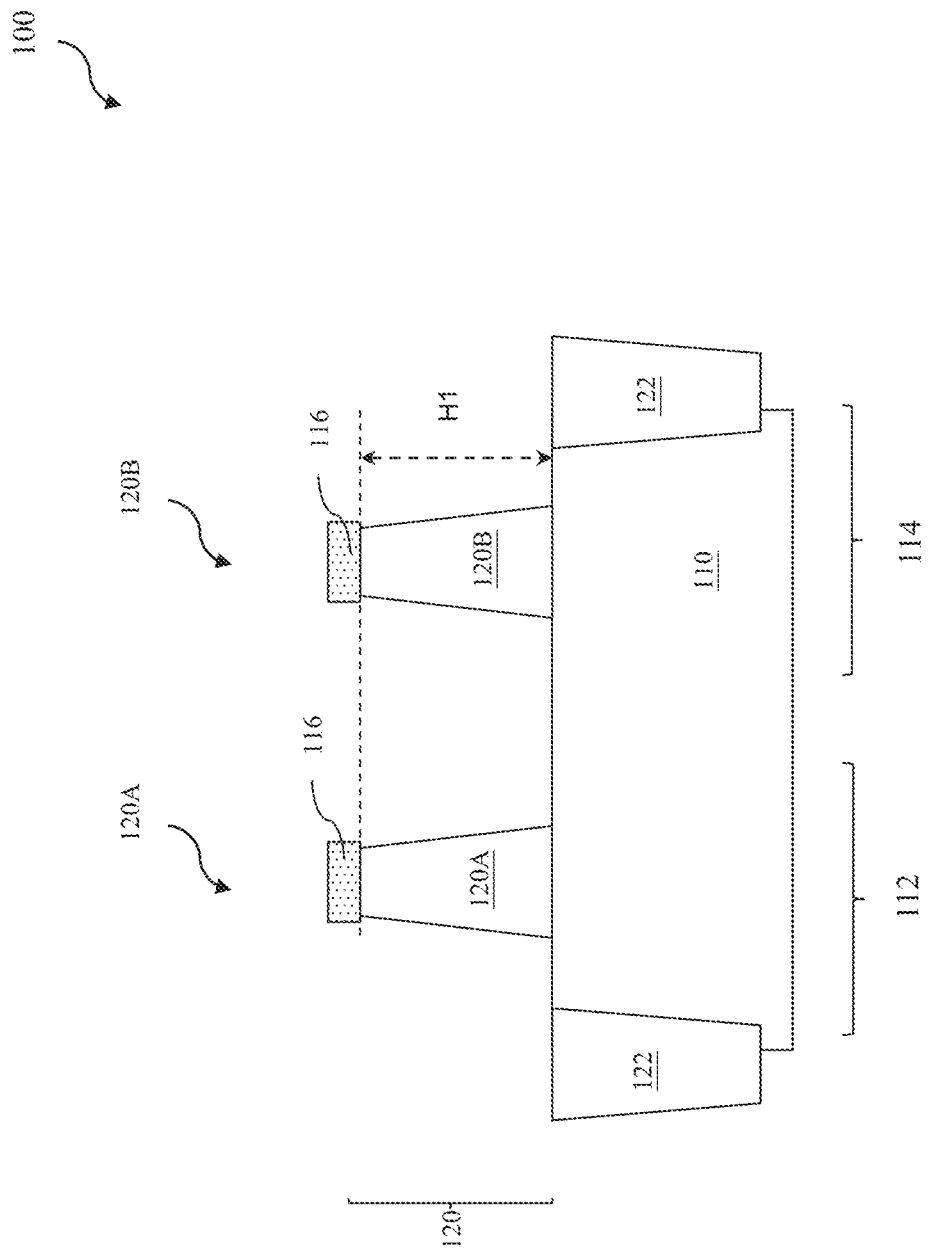

Referring to FIGS. 3 and 12, the method 200 includes an operation 206 by forming a plurality of isolation features 122 in the semiconductor substrate 110. In the present embodiment, the isolation features 122 are shallow trench isolation (STI) features 122. The STI features 122 are formed in the semiconductor substrate 110 and define various active regions. In this case, the first region 112 and the second region 114 are within a same active region. Furthermore, the top surface 121 of the semiconductor substrate 110 and top surfaces of the STI features 112 are coplanar at the present fabrication stage.

Since the presence of the semiconductor mesas 120, the formation of the STI features 122 is designed to avoid the damage to the semiconductor mesas 120.

In one embodiment, the formation of the STI features 122 includes: forming a hard mask with openings that define the regions for STI features; etching the semiconductor substrate 110 through the openings of the hard mask to form trenches; depositing dielectric material to fill in the trenches; performing a chemical mechanical polishing (CMP) process to remove excessive dielectric material above the semiconductor mesa 120; and then selectively etching back the dielectric material to the top surface of the semiconductor substrate 110, resulting in the STI features 122. In the CMP process, the patterned hard mask 116 may serve as a polishing stop layer such that the CMP process properly stops on the patterned hard mask 116. In the etch-back process, the patterned hard mask 116 may serve as an etch mask to further protect the semiconductor mesas 120 from loss.

In another embodiment, the STI features 122 are formed before the formation of the semiconductor mesas 120. In furtherance of the embodiment, the formation of the STI features 122 includes: forming a hard mask with openings that define the regions for STI features; etching the semiconductor substrate 110 through the openings of the hard mask to form deep trenches; depositing dielectric material to fill in the trenches; and performing a CMP process to remove excessive dielectric material above the semiconductor substrate 110, resulting in deep trench isolation features. Thereafter, the operations 202 and 204 are performed to form the patterned hard mask 116 and to form the semiconductor mesas 120, respectively. However, in the operation 204 to recess the semiconductor substrate 110 by an etch process, the etch process is designed to recess both the semiconductor material (silicon in the present embodiment) of the semiconductor substrate 110 and the dielectric material of the deep trench isolation features. Thus, the upper portions of the deep trench isolation features are removed, resulting in shallow trench isolation features 122. The height difference between the deep trench isolation features and the STI features 122 is about the height H1 of the semiconductor mesa 120.

In another embodiment, the deposition of the dielectric material includes thermal oxidation of the trenches and then filling in the trenches by the dielectric material, such as silicon oxide, by CVD. In one example, the CVD process to fill in the trenches includes high density plasma CVD (HDPCVD).

Figure 4:
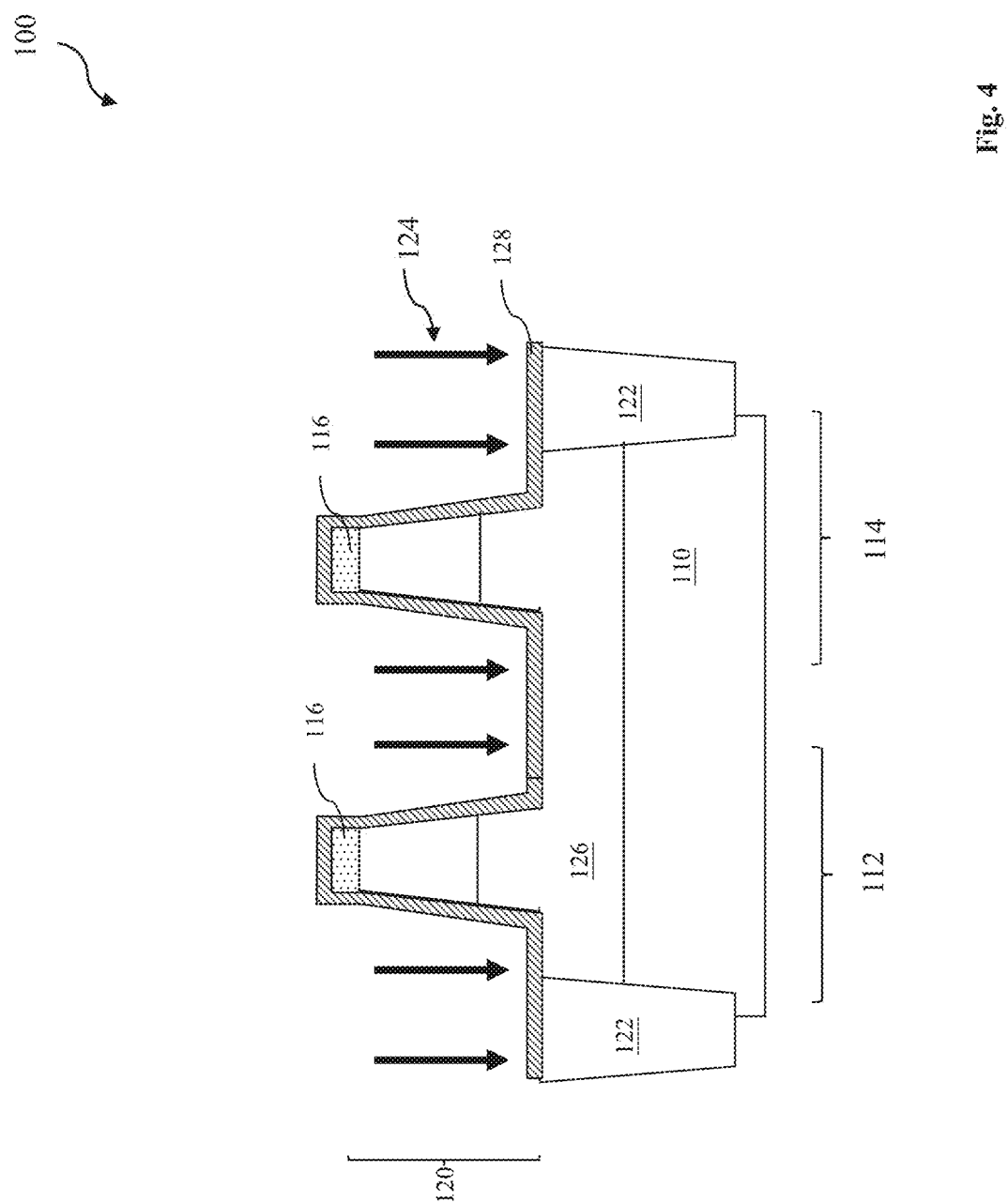

Referring to FIGS. 4 and 12, the method 200 includes an operation 208 to form the drain 126 of the TFET by a first ion implantation process 124. The drain 126 is formed in the bottom portion of the first semiconductor mesa 120, the bottom portion of the first semiconductor mesa 120 and a portion of the semiconductor substrate 110 below the top surface 121. The drain 126 is a continuous doped feature extending from the first semiconductor mesa 120A to the second semiconductor mesa 120B through the semiconductor substrate 110. In the present embodiment, the drain 126 includes a n-type dopant (such as phosphorous) when the TFET is n-type or a p-type dopant (such as boron) when the TFET is p-type.

In one embodiment, the operation 208 includes depositing a screening layer 128 on the semiconductor substrate 110 and the semiconductor mesas 120; and performing a selective implantation to the semiconductor substrate 110 and the semiconductor mesas 120. The screening layer 128 is used for implantation screening and elimination of the channeling effect during the implantation.

Particularly, the selective implantation includes forming a patterned photoresist layer on the semiconductor substrate 110, performing the ion implantation process 124 using the patterned photoresist layer as an implantation mask, and removing the patterned photoresist layer thereafter by wet stripping or plasma ashing. The patterned photoresist layer covers other regions not intended for the ion implantation process 124. The patterned photoresist layer is formed by a lithography process as described above.

The drain 126 formed by the ion implantation 124 is further annealed for activation by an annealing process. The annealing process is implemented right after the ion implantation 124 in the operation 208 or is alternatively implemented after the formation of other doped features for collective activation. In one embodiment, the annealing process includes rapid thermal annealing (RTA). In other embodiments, the annealing process alternatively includes laser annealing, spike annealing, million second anneal (MSA) or other suitable annealing technique.

Figure 5:
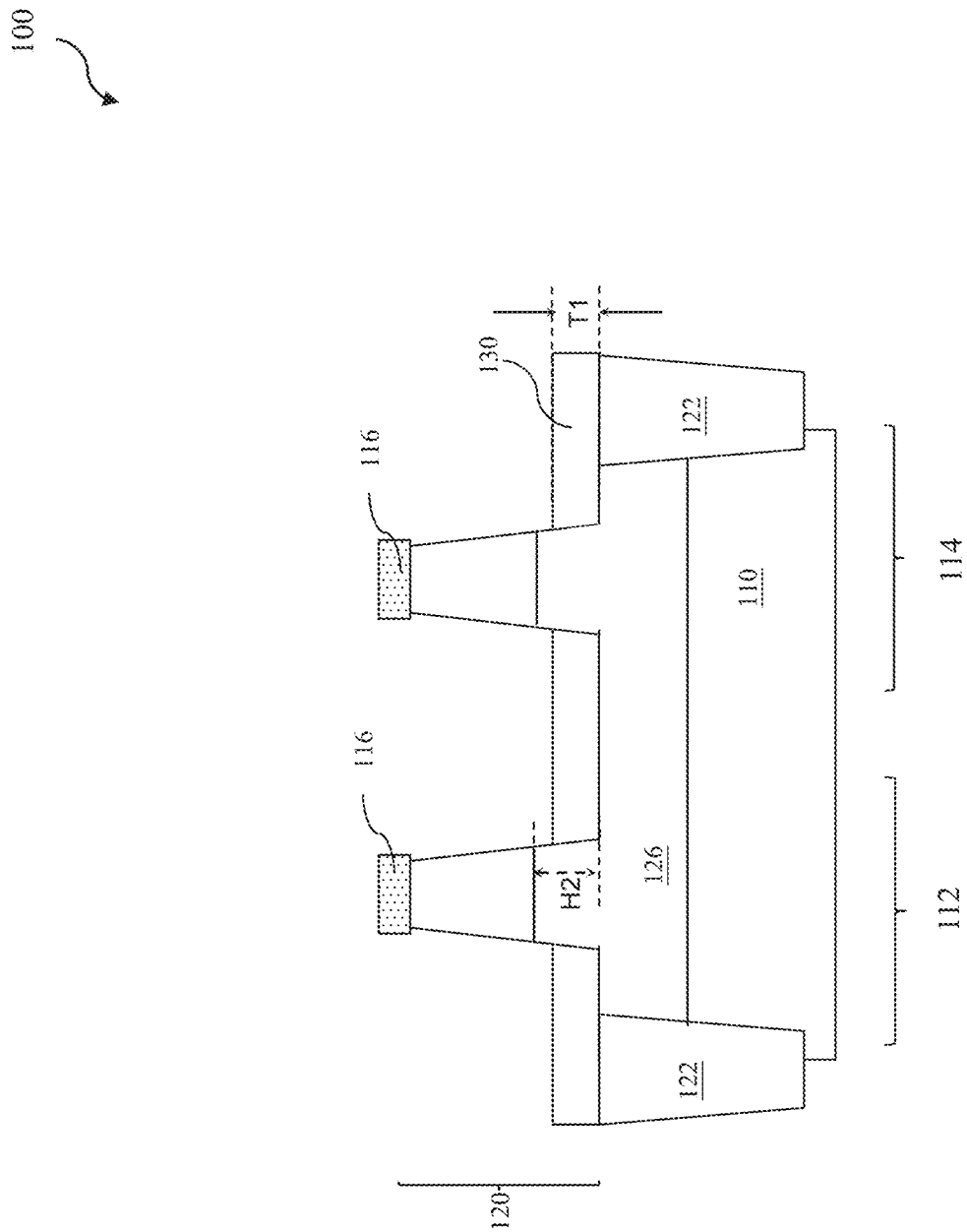

Referring to FIGS. 5 and 12, the method 200 includes an operation 210 to form a TFET isolation layer 130. The TFET isolation layer 130 provides isolation function to and properly configures various features of the TFET. For examples, the gate is properly aligned with the channel, not directly formed on the semiconductor substrate 110, and is substantially off from the drain.

The TFET isolation layer 130 includes a dielectric material, such as silicon oxide in the present example. The TFET isolation layer 130 may alternatively include other suitable dielectric material. The TFET isolation layer 130 is disposed on the semiconductor substrate 110. Particularly, the thickness T1 of the TFET isolation layer 130 is chosen such that the subsequent formed gate can be properly configured with the channel and the drain. As illustrated in FIG. 5, "H2" is the height of the drain 126 measured from the top surface of the semiconductor substrate 110 up to the top surface of the drain 126. The thickness T1 of the TFET isolation layer 130 is chosen such that T1 is little less H1 as T1<H1, to has a small overlap between the gate and drain, and to further ensure that the gate completely couples with the channel.

In one embodiment, the operation 210 includes removing the screen layer 128 by an etch process (such as a wet etch); and forming a dielectric material layer (such as silicon oxide in the present embodiment) on the semiconductor substrate 110. In one embodiment, the forming of the dielectric material layer includes depositing a dielectric material, performing a CMP process to remove a portion of the dielectric material above the semiconductor mesas 120, and etch back the dielectric material. In another embodiment, the dielectric material layer is selectively removed from other regions by a procedure including forming a patterned photoresist layer on the semiconductor substrate 110, performing an etch process to the dielectric material layer using the patterned photoresist layer as an etch mask, and removing the patterned photoresist layer thereafter by wet stripping or plasma ashing.

Figure 6:
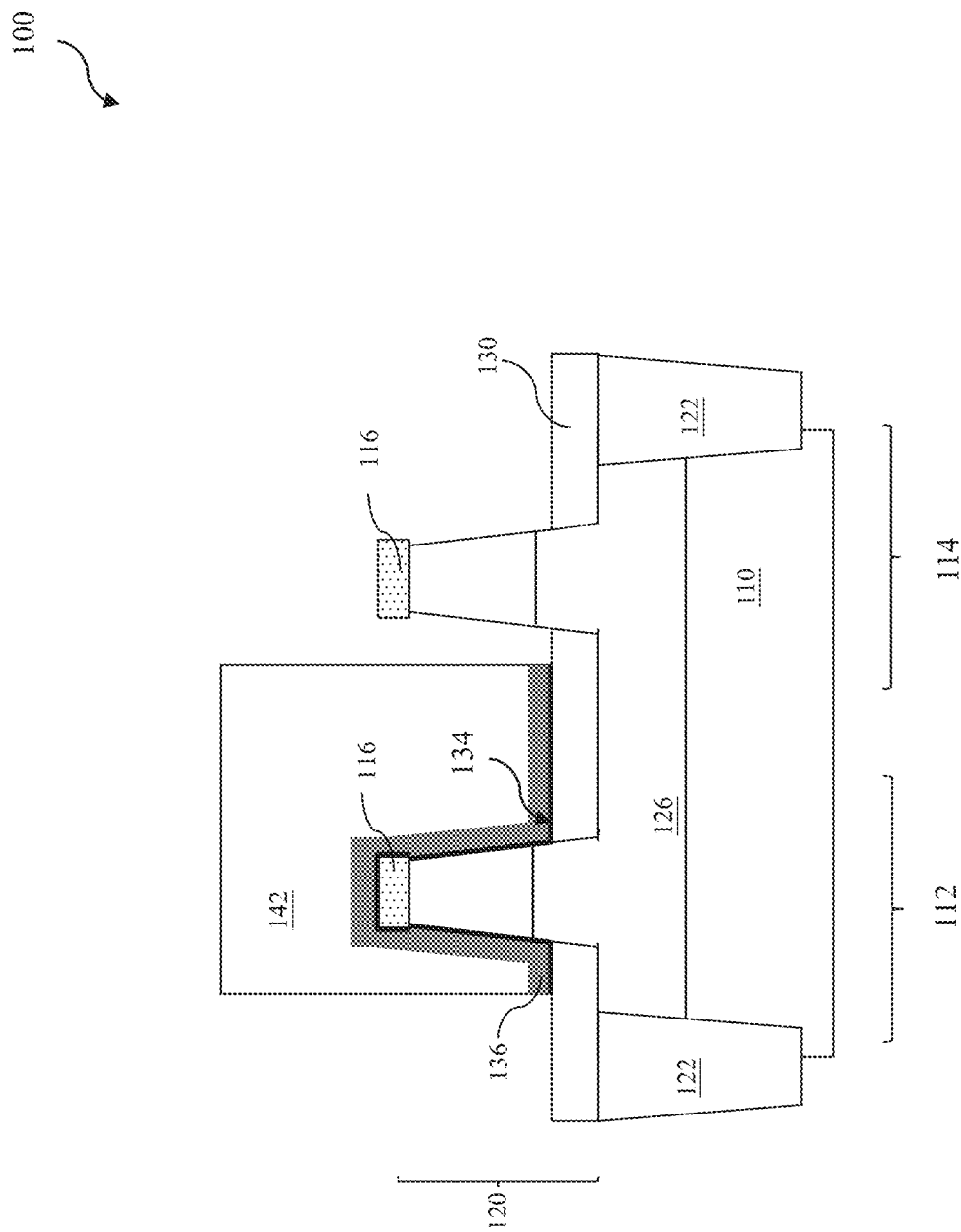

Referring to FIGS. 6 and 12, the method 200 includes an operation 212 to form gate stack on the semiconductor substrate 110. The formation of the gate stack includes forming gate material layers and patterning the gate material layers to form the gate stack.

The gate material layers are formed on the first semiconductor mesa 120A and on the TFET isolation layer 130. Especially, the gate material layers are formed on sidewalls of the first semiconductor mesa 120A and on the top surface thereof as well. In the present case, the gate material layers are disposed on the patterned hard mask 116.

The gate material layers include gate a dielectric material layer 134 and a gate electrode layer 136. In the present embodiment, the gate material layers include high k dielectric material and metal, therefore, referred to as high k metal gate. In one embodiment, the gate dielectric material layer 134 includes an interfacial layer (such as silicon oxide) and a high k dielectric material layer. A high k dielectric material is a dielectric material having a dielectric constant greater than that of thermal silicon oxide. For example, a high k dielectric material includes hafnium oxide (HfO) or other suitable metal oxide. The gate electrode layer 136 includes a metal (or metal alloy) layer and may further include a polycrystalline silicon (polysilicon) layer on the metal layer.

The operation 212 includes depositing various gate materials on the semiconductor substrate, specifically on the TFET isolation feature 130 and the semiconductor mesas 120. Especially as described in one embodiment where the semiconductor mesa 120A has a trapezoidal profile, it is beneficial for depositions of various gate materials. In one embodiment, the formation of the interfacial layer (silicon oxide in the present example) includes thermal oxidation, ALD, CVD or other suitable technology. In another embodiment, the formation of the high k dielectric material layer includes ALD, metalorganic CVD (MOCVD), physical vapor deposition (PVD), or other suitable technology. In yet another embodiment, the formation of the metal layer includes PVD, plating, or other suitable technology. In yet another embodiment, the formation of the polysilicon layer includes CVD or other suitable technology.

The operation 212 also includes patterning the gate material layers including the gate dielectric material layer 134 and the gate electrode layer 136, resulting in a gate material stack in the first region 112. The material stack includes a first portion on the top of the first semiconductor mesa 120A, a second portion on the sidewall of the first semiconductor mesa 120A, and a third portion on the top surface of the TFET isolation layer 130. The third portion of the material stack is horizontally extended on the TFET isolation layer 130.

In one embodiment, the patterning of the gate material layers includes forming a patterned photoresist layer 142 on the gate material layers, performing an etch process to the gate material layers using the patterned photoresist layer 142 as an etch mask, and removing the patterned photoresist layer 142 thereafter by wet stripping or plasma ashing. In one example, the etch process includes more than one etch steps using different etchants to etch respective materials in the gate material layers. Each etchant is designed to effectively etch the respective material. The patterned photoresist layer 142 is formed by a lithography process. The patterned photoresist layer 142 covers the semiconductor substrate 110 in the first region 112, as illustrated in FIG. 6.

Figure 7:
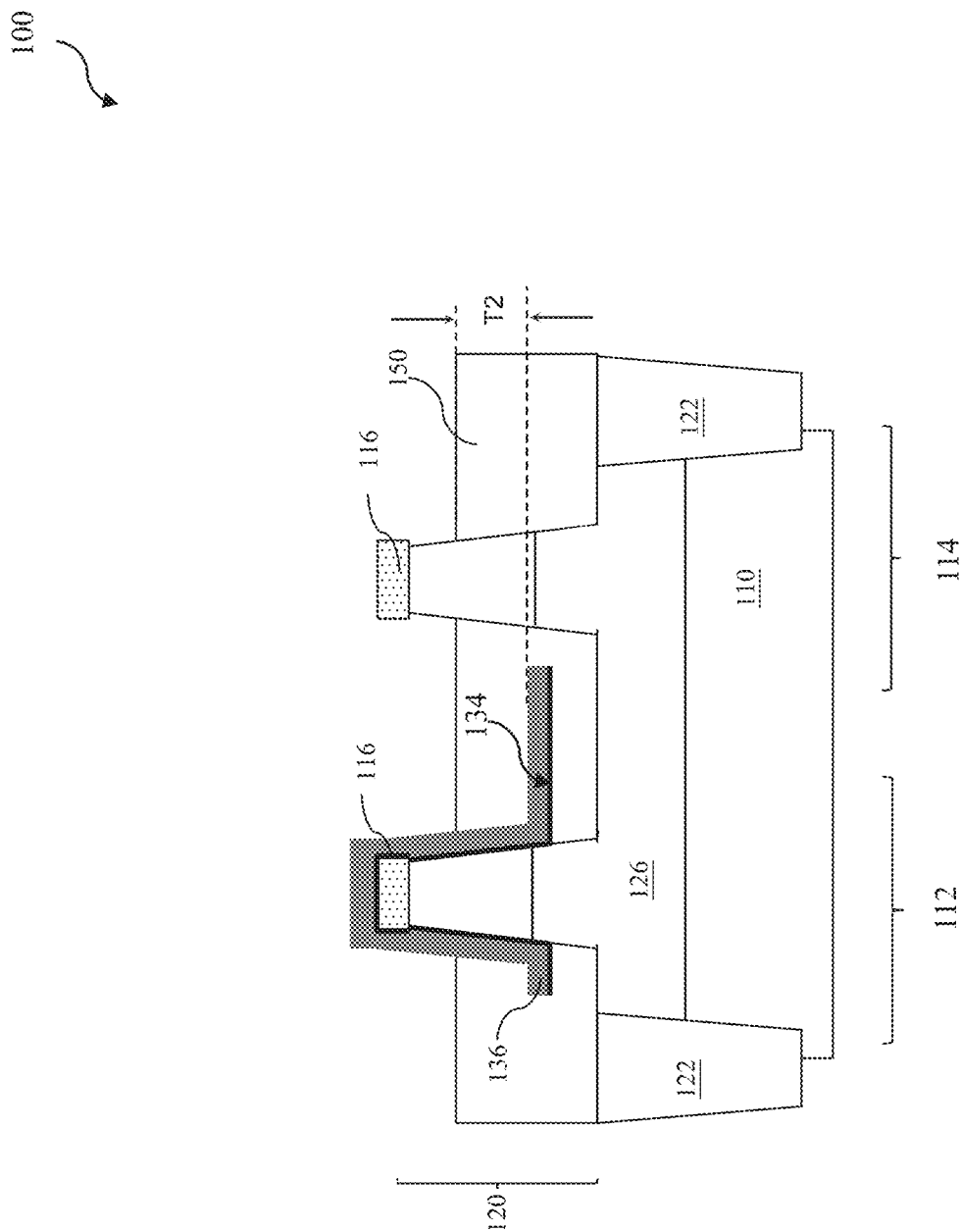

Referring to FIGS. 7 and 12, the method 200 may include an operation 214 to form a TFET isolation layer 150 on the semiconductor substrate 110. The TFET isolation layer 150 provides isolation function to and properly configures various features of the TFET. For examples, the source of the TFET is properly configured thereby.

The TFET isolation layer 150 includes a dielectric material, such as silicon oxide in the present example. The TFET isolation layer 150 may alternatively include other suitable dielectric material, such as low k dielectric material. The TFET isolation layer 150 is disposed on the semiconductor substrate 110, the TFET isolation layer 130 and the gate material stack. Particularly according to the present embodiment, the thickness of the TFET isolation layer 150 is chosen such that a remaining isolation thickness T2 is about ⅓ of the total vertical height of the semiconductor mesa 120. The remaining isolation height T2 is a vertical dimension measured from the top surface of the horizontal portion of the material stack up to the top surface of the TFET isolation layer 150. The length of the channel is associated with the remaining isolation thickness T2 and is determined thereby.

In one embodiment, the operation 214 includes deposition of the dielectric material (silicon oxide in the present example), performing a CMP process to remove excessive dielectric material above the semiconductor mesa 120, and etching back to recess the dielectric material to reach the desired thickness range.

In the present embodiment, the TFET isolation layer 130 and the TFET isolation 150 both include silicon oxide and are collectively labeled with numeral 150 in FIG. 7.

Figure 8:
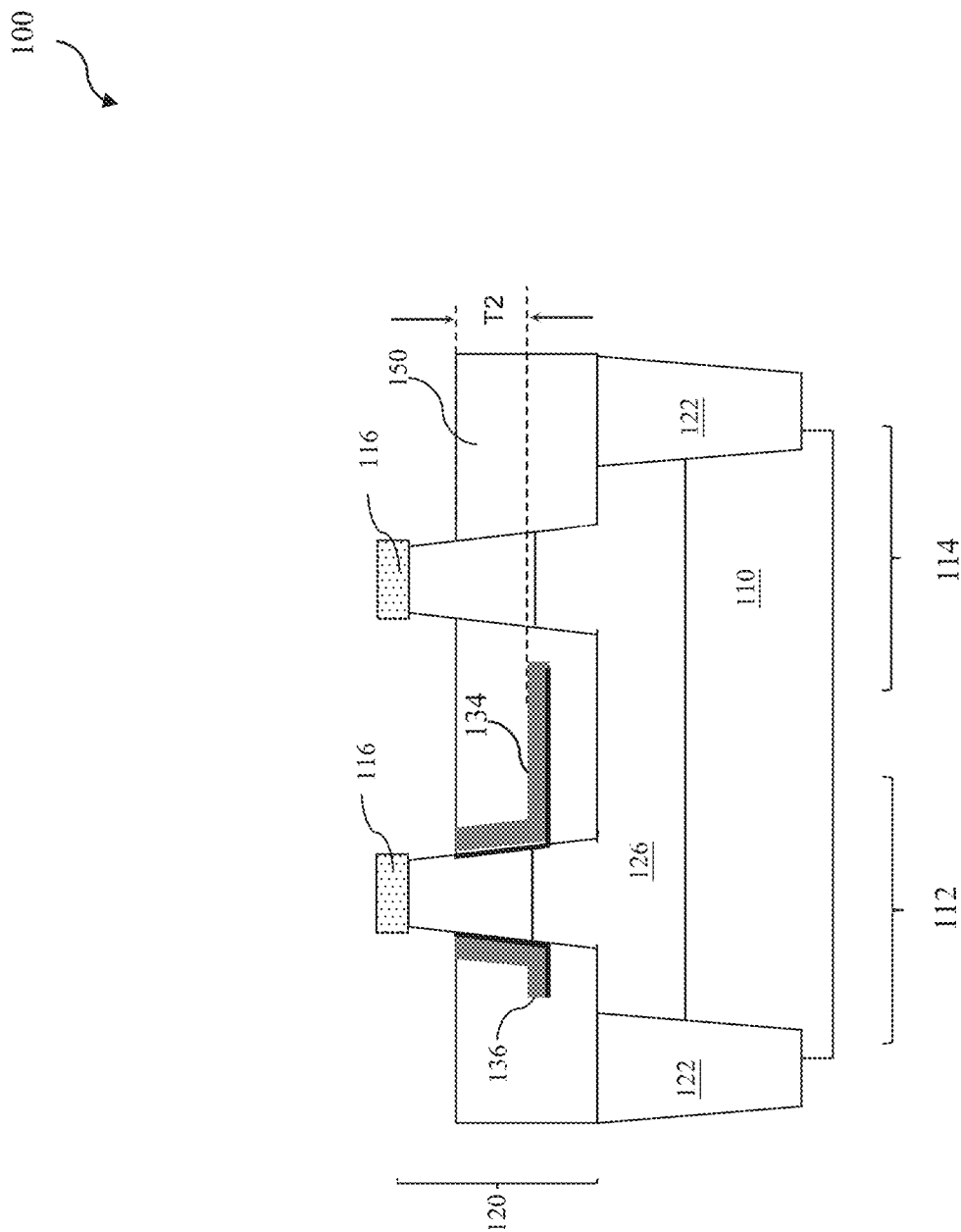

Referring to FIGS. 8 and 12, the method 200 includes an operation 216 to remove a portion of the gate material stack uncovered by the TFET isolation layer 150. The operation 216 includes an etch process to selectively etch the gate material layers in the top portion of the gate material stack. The etch process may include more than one steps tuned to etch respective gate material layers. By removing the top portion of the gate material stack, the gate of the corresponding TFET is formed on the sidewall of the middle portion of the first semiconductor mesa 120A with a horizontal extending portion for contact.

Figure 9:
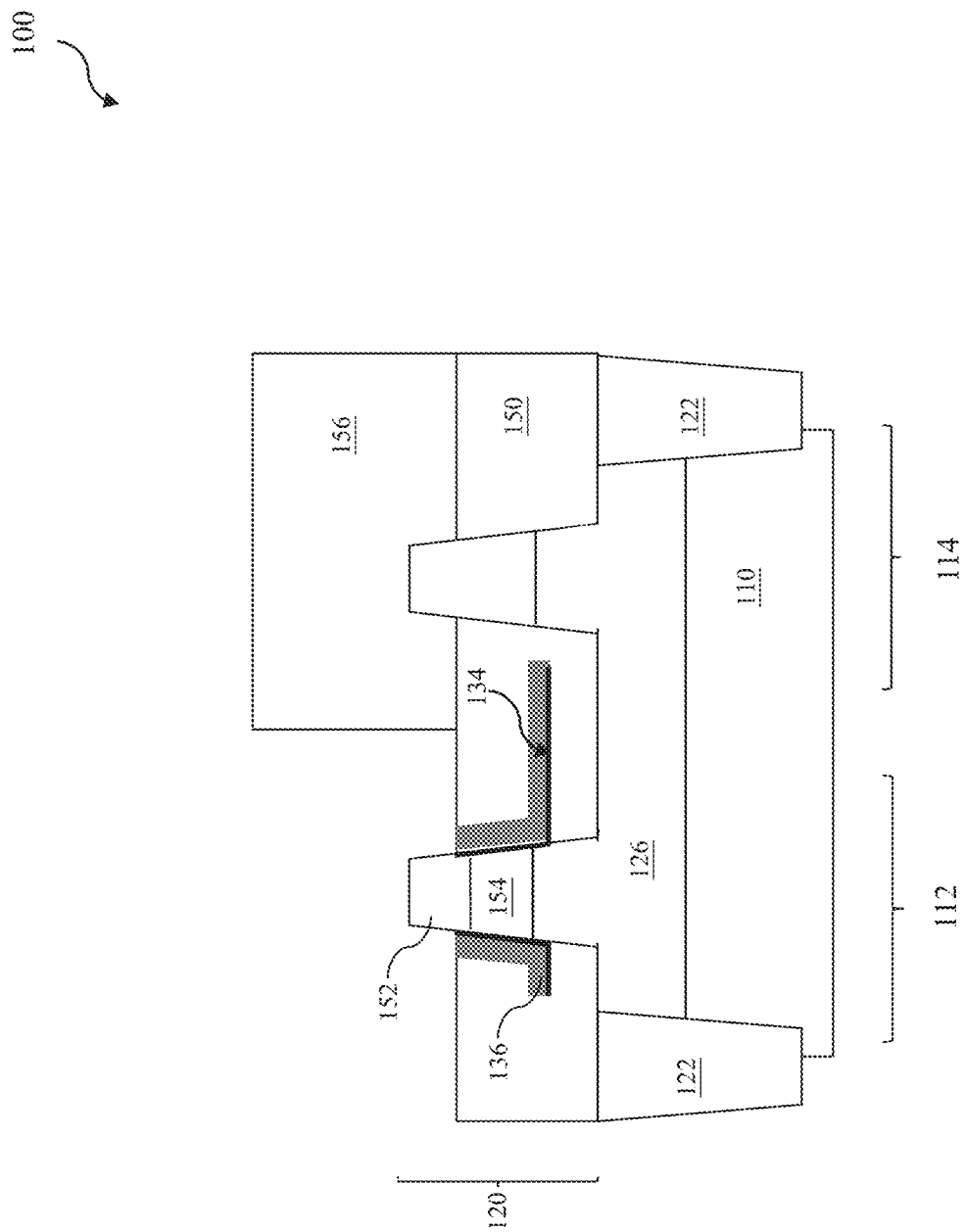

Referring to FIGS. 9 and 12, the method 200 includes an operation 218 to form a source 152 of the TFET device in the first semiconductor mesa 120A. In the present embodiment, the source 152 is formed in the top portion of the first semiconductor mesa 120A. Particularly, the drain 126 has a first type conductivity and the source 152 has a second type conductive that is opposite from the first type conductivity. For example, if the first type conductivity is n-type (or p-type), the second type conductivity is p-type (or n-type). In one embodiment where the TFET is n-type, the drain 126 includes a n-type dopant (such as phosphorous) and the source 152 includes a p-type dopant (such as boron). In another embodiment where the TFET is p-type, the drain 126 includes a p-type dopant and the source 152 includes a n-type dopant. A channel 154 is defined in the middle portion of the first semiconductor mesa 120A.

In one embodiment, the operation 218 includes removing the hard mask 116, forming a patterned photoresist layer on the TFET isolation layer 156, performing the ion implantation process using the patterned photoresist layer as an implantation mask, and removing the patterned photoresist layer 156 thereafter. The patterned photoresist layer 156 has an opening configured such that the first semiconductor mesa 120A is uncovered by the patterned photoresist layer. During the ion implantation, the TFET isolation layer 150 serves as an implantation mask in addition to the patterned photoresist layer 156 so that only the top portion of the first semiconductor mesa 120A is implanted thereby.

In yet another embodiment, the operation 218 further includes recessing the first semiconductor mesa 120A and epitaxy growing on the recessed semiconductor mesa 120A with a semiconductor material that is same to that of the semiconductor substrate 110 (such as silicon) or different (such as silicon germanium). Dopant of the source 152 may be introduced by an ion implantation by in-situ doping. In the in-situ doping, the epitaxy growth includes a precursor having the corresponding dopant chemical so that the dopant is simultaneously formed during the epitaxy growth. This method may achieve a high doping concentration of the source 152. In a particular example, the operation 218 includes removing the hard mask 116, recessing a portion of the semiconductor mesa 120A by an etch process, and epitaxy growing on the recessed semiconductor mesa with in-situ doping. According to one embodiment, by recessing and epitaxy growth, thus formed source 152 has a smoother interface between the source and the channel. Furthermore, the corresponding junction has an enhanced performance. When a different semiconductor material is epitaxy grown for the source, a proper strain effect may be generated for the enhanced mobility and device performance.

The operation 218 may further include an annealing process to anneal the source 152 for activation. The annealing process may be implemented right after the corresponding ion implantation (or epitaxy growth) or is alternatively implemented after the formation of other doped features for collective activation. In various examples, the annealing process includes RTA, laser annealing, spike annealing, MSA, or other suitable annealing technique.

The channel 154 is defined between the source 152 and the drain 126. Particularly, the channel 154 is defined in the middle portion of the first semiconductor mesa 120A. The channel 154 is vertically configured so that the current of the TFET vertically flows through the channel 154 from the source 152 to the drain 126.

In one embodiment, the channel 154 is neutral (undoped). In another embodiment, the channel is lightly doped. In one example, the channel 154 has a conductivity type same to the conductivity type of the drain 126. For instance, the channel has a n-type dopant when the TFET is n-type, or the channel has a p-type dopant when the TFET is p-type. In this case, the doping concentration of the channel 154 is substantially less than that of the drain 126.

In the present embodiment, the source 152 has a small overlap with the gate stack of the TFET to ensure that the channel 154 is completely coupled with and controlled by the gate stack.

Figure 10:
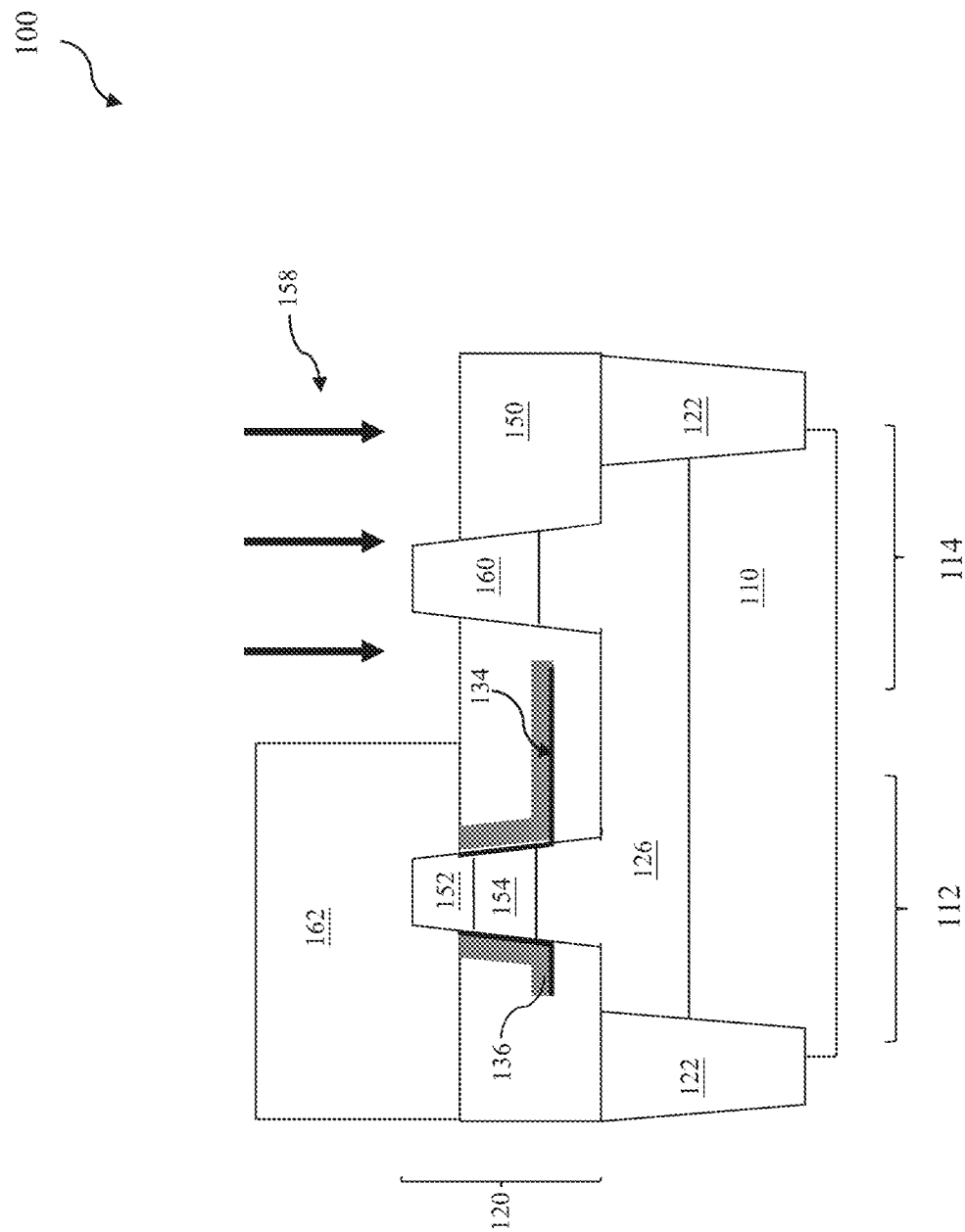

Referring to FIGS. 10 and 12, the method 200 includes an operation 220 to perform an ion implantation 158 to form the drain pickup feature 160 of the TFET. The drain pickup feature 160 is formed in a top portion of the second semiconductor mesa 120B. The drain pickup feature 160 has a same type of conductivity as that of the drain 126 and is contacted with the drain 126 but has a doping concentration greater than that of the drain 126 to reduce the contact resistance. In the present embodiment, the drain pickup feature 160 includes a n-type dopant (such as phosphorous) when the TFET is n-type or a p-type dopant (such as boron) when the TFET is p-type.

In one embodiment, the operation 220 includes forming a patterned photoresist layer 162 to cover the first semiconductor mesa 120A in the first region 112; and performing the ion implantation 158 to the second semiconductor mesa 120B using the patterned photoresist layer 162 as an implantation mask, and removing the patterned photoresist layer thereafter by wet stripping or plasma ashing.

The drain pickup feature 160 formed by the ion implantation 158 may be further annealed for activation by an annealing process. The annealing process may be implemented after the ion implantation 158 in the operation 220 or is alternatively implemented after the formation of other doped features for collective activation.

Figure 11:
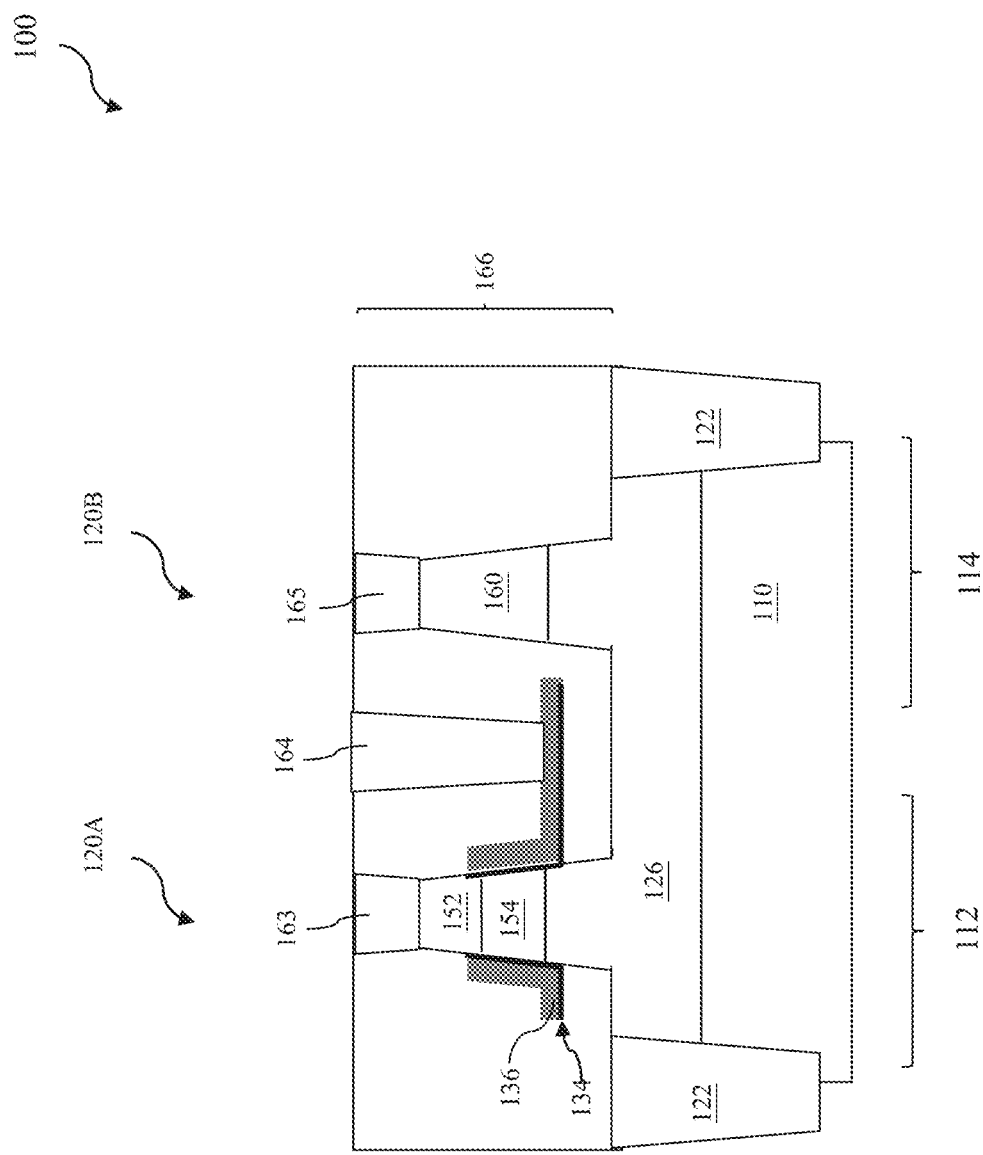
Figure 12:
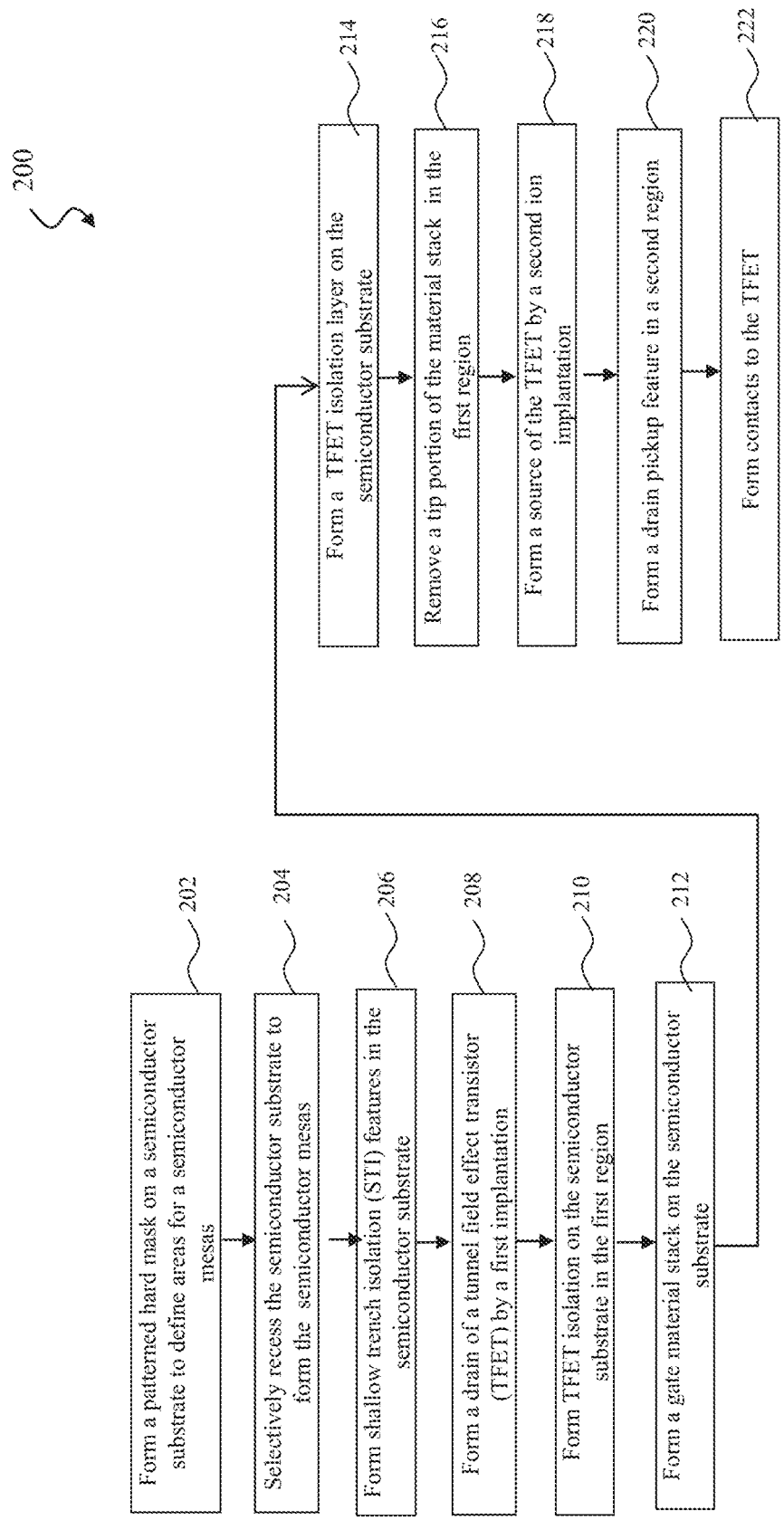
FIG. 12 is a flowchart of a method to form the semiconductor structure of FIG. 11 constructed according to one embodiment.

Referring to FIGS. 11 and 12, the method 200 may further include an operation 222 to form various contacts to the TFET. In the present embodiment, the contacts 163, 164 and 165 are formed in an interlayer dielectric (ILD) 166. The contact 163 is configured to land on the first semiconductor mesa 120A and is electrically connected to the source 152. The contact 164 is configured to land on the horizontal portion of the gate and is electrically connected to the gate. The contact 165 is configured to land on the second semiconductor mesa 120B and is electrically connected to the drain pickup feature 160, therefore is electrically connected to the drain 126. Particularly, the source contact 163 and the drain contact 165 have a same height since the drain has a raised structure such that the source and drain are in the same horizontal level.

In FIG. 11, the ILD 166 collectively refers to the dielectric material layers that include the TFET isolation layer 130 and the TFET isolation layer 150 and further include a dielectric material layer deposited on the TFET isolation layer 150. The ILD 166 includes silicon oxide or a low k dielectric material or other suitable dielectric material. In various embodiment, the ILD 166 includes silicon oxide, silicon nitride, silicon oxynitride, polyimide, spin-on glass (SOG), fluoride-doped silicate glass (FSG), carbon doped silicon oxide, low-k dielectric material, and/or other suitable materials. The ILD 166 may be formed by a technique including spin-on, CVD, sputtering, or other suitable processes.

The contacts are conductive components in the interconnect structure and provide electrical routing between the devices and the metal line in the vertical direction. In one embodiment, the operation 222 includes depositing a dielectric material layer for the ILD, performing a CMP process to planarize the ILD, forming a patterned mask layer having a plurality of openings to define the regions for the contacts, etching to form the contact holes using the patterned mask layer as an etch mask, filling a conductive material in the contact holes, and performing another CMP process to remove the excessive conductive material formed on the ILD. The patterned mask layer may be a patterned hard mask layer or alternatively a patterned photoresist layer. The patterned hard mask layer is similar to the patterned hard mask 116 in terms of formation and composition. The formation of the patterned photoresist layer is similar to that of the other patterned photoresist layers previously described. The conductive material of the contacts includes metal, metal alloy or other suitable conductive material. In the present embodiment, the conductive material of the contacts includes tungsten (W). The contacts may further include other material. For example, the contacts include a lining layer, such as titanium nitride or tantalum nitride, formed on the sidewalls of the contact holes before the filling of the conductive material to the contact holes. The filling of the conductive material in the contact holes may use a suitable technology, such as CVD or plating.

The operation 222 may further includes forming other interconnect features and other fabrication steps (such as passivation) in the backend of the line. The interconnect structure includes horizontal conductive features (metal lines) and vertical conductive features (such as vias and contacts). The interconnect structure includes conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable process. The metal silicide used in multilayer interconnects may include nickel silicide, cobalt silicide, tungsten silicide, tantalum silicide, titanium silicide, platinum silicide, erbium silicide, palladium silicide, or combinations thereof.

Other fabrication steps may be implemented before, during and after the operations of the method 200.

Thus formed semiconductor structure 100 includes a vertical TFET and may further include another device integrated with the vertical TFET in a circuit. In one embodiment, the source and drain are leveled, the source contact and the drain contact have a same height, the source and drain contacts can be formed in a same procedure with less fabrication cost and improved performance and reliability. In another embodiment, the raised drain structure may be used as a resistor, as various embodiments described below.

The method 200 and the semiconductor structure 100 made thereby are described above in various embodiments. However, the present disclosure may include other alternatives and modifications. For example, the source and drain are switched such that the drain is formed on the top portion of the first semiconductor mesa 120A, and the source is formed on the bottom portion of the first semiconductor mesa 120A and is extended to the second semiconductor mesa 120B through the semiconductor substrate 110.

Figure 13:
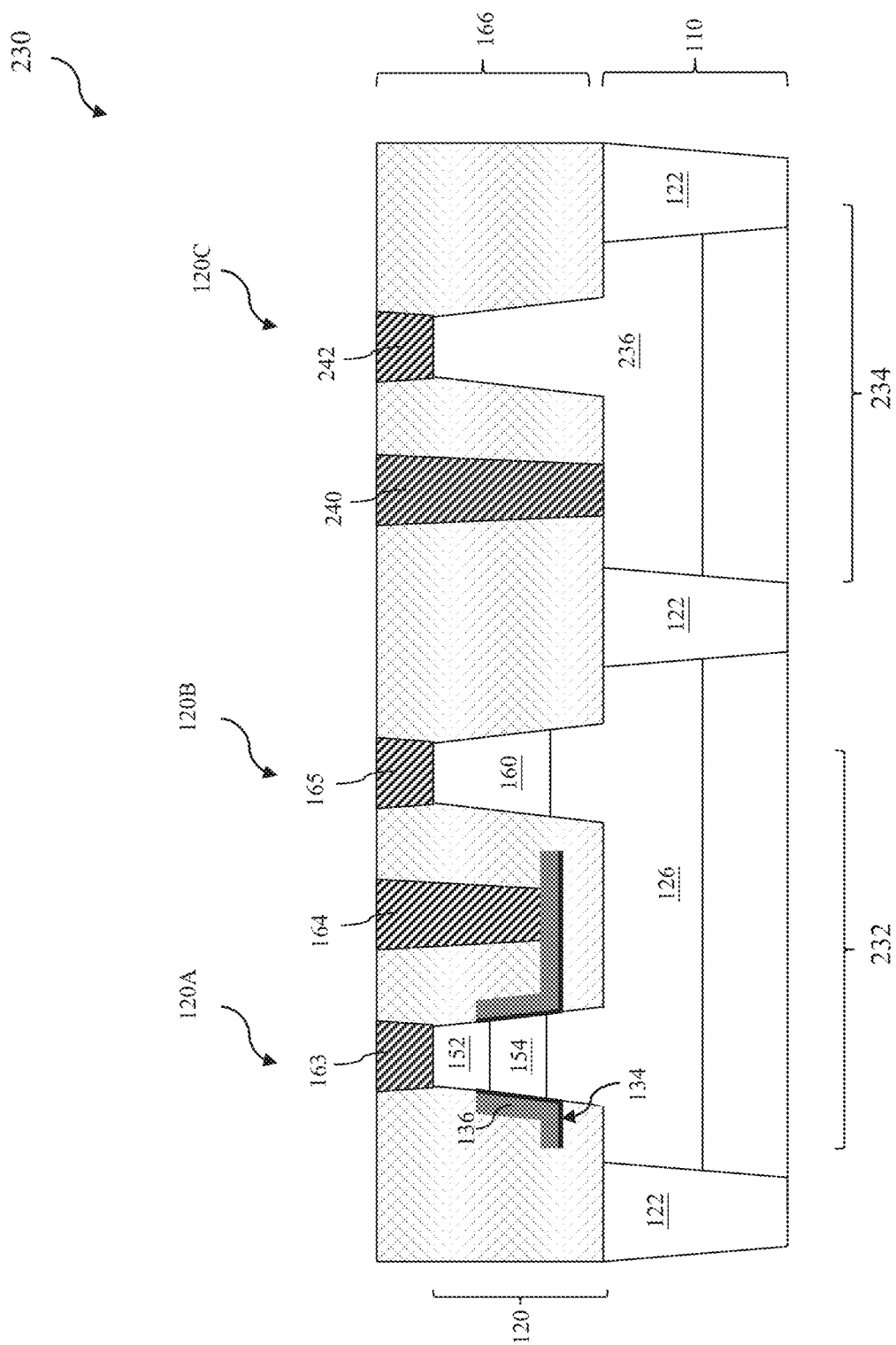
FIG. 13 is a sectional view of a semiconductor structure having a TFET structure and a capacitor constructed according to another embodiment.

FIG. 13 is a sectional view of a semiconductor structure 230 constructed according to another embodiment of the present disclosure. Similar descriptions (including features and operations to form the features) are eliminated for simplicity. The semiconductor structure 230 includes a vertical TFET in the first active region 232 and a resistor in the second active region 234. In this embodiment, the vertical TFET is similar to the one in FIG. 11 and the resistor in the second active region 234 is formed in a third semiconductor mesa 120C in the second active region 234 and is further extended to the semiconductor substrate 110. Particularly, the resistor has a continuous doped feature 236 including a vertical portion formed in the third semiconductor mesa 120C and a horizontal portion formed in the semiconductor substrate 110. The resistor is a two terminal passive device with two contacts 240 and 242 contacting to the two ends of the resistor. The contact 240 lands on the semiconductor substrate 110 and contacts to one end of the doped feature 236. The contact 242 lands on the third semiconductor mesa 120C and contacts to another end of the doped feature 236.

The semiconductor structure 230 is formed by a method similar to the method 200. In one embodiment, the doped feature 236 is formed by the operation 208 to form the drain 126. In one example, the hard mask 116 on the third semiconductor mesa 120C is removed and the operation 208 is executed thereafter so that the corresponding implantation process 124 introduce the dopant into the top portion of the third semiconductor mesa 120C as well and the doped features 236 is thus extended from the top surface of the third semiconductor mesa 120C to the semiconductor substrate 110 within the second active region 234.

In another embodiment, the doped feature 236 is formed in the operation 220 to form the drain pickup feature 160. In this case, the TFET isolation layers 130 and 150 are patterned in the corresponding operations such that the second active region 234 is not covered by the TFET isolation layers.

In another embodiment, the doped region 236 is formed by a separate ion implantation. Since the doped feature 236 functions as a resistor, the resistance of the resistance thus can be tuned by the dopant concentration.

As noted above, two contacts 240 and 242 are formed on two sides of the doped feature 236. In other embodiment, more contacts are formed on two sides of the doped feature 236. For example, multiple contacts are formed on the left side of the doped feature 236 and are configured along the left side, serving as a first terminal of the resistor. Multiple contacts are formed on the right side of the doped feature 236 and are configured along the right side, serving as a second terminal of the resistor.

Figure 14:
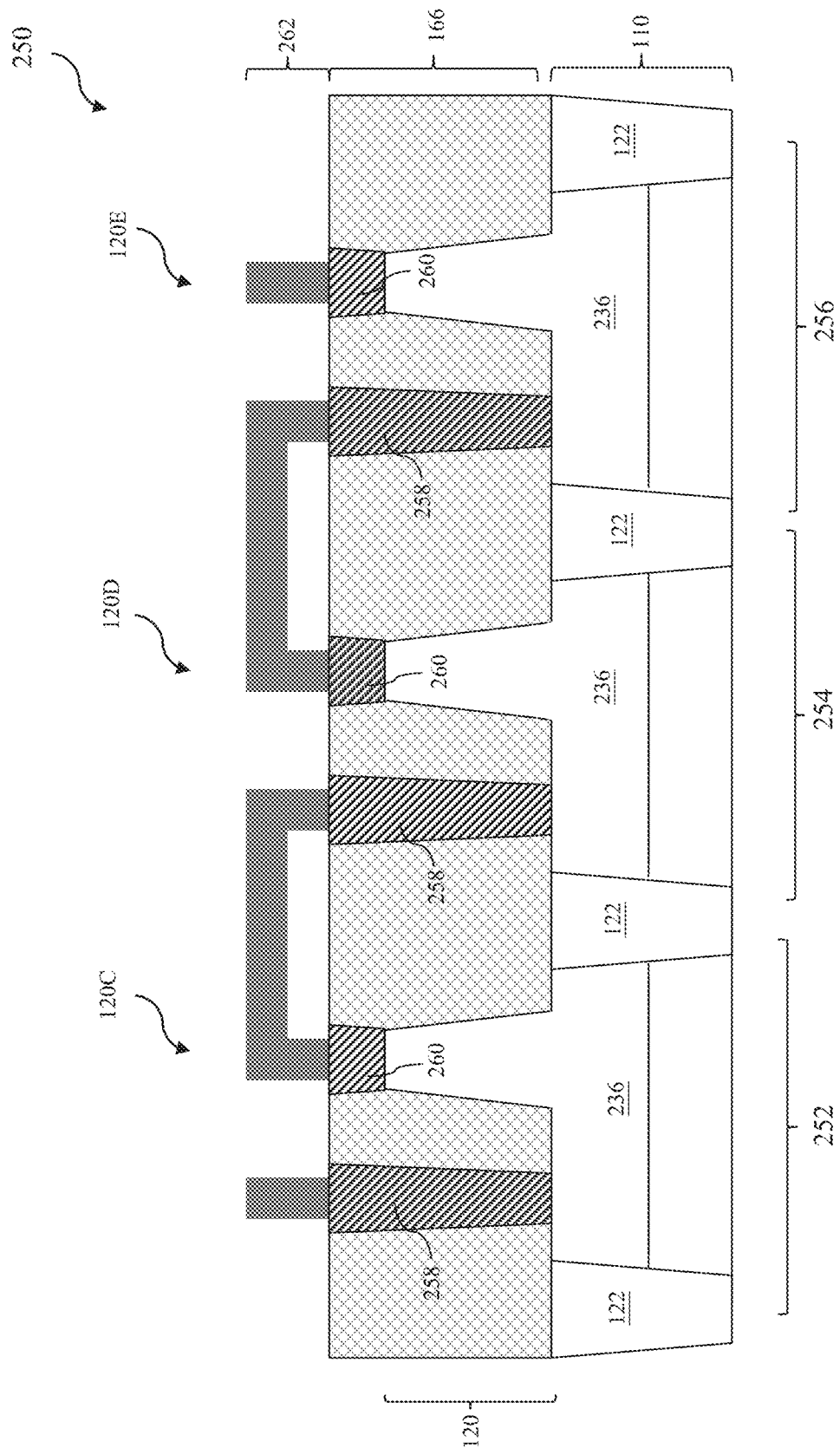
FIG. 14 is a sectional view of a semiconductor structure having a resistor constructed according to another embodiment.

FIG. 14 is a sectional view of a semiconductor structure 250 constructed according to another embodiment of the present disclosure. The semiconductor structure 250 includes a plurality of resistors connected in series. FIG. 14 only shows three resistors for illustration. Each resistor is similar to the resistor of FIG. 13 and is formed by the same method. The semiconductor structure 250 includes a plurality of STI features 122 formed in the semiconductor substrate 110, defining a plurality of active regions, such as active regions 252, 254 and 256 in the present example. Each active region includes a semiconductor mesa, such as semiconductor mesas 120C, 12D and 120E in the active regions 252, 254 and 256, respectively. Each active region includes a resistor having a doped feature 236 formed in the corresponding semiconductor mesa and extended to the semiconductor substrate 110 in the corresponding active region. In the present example, the semiconductor structure 250 includes a first resistor, a second resistor and a third resistor associated with the first, second and third semiconductor mesas (120C, 120D and 120E), respectively.

Each resistor is connected to the two terminals: a first contact 258 landing on the semiconductor substrate as a first terminal and a second contact 260 landing on the respective semiconductor mesa as a second terminal.

Furthermore, the semiconductor structure 250 includes various conductive features 262 in the interconnect structure. The conductive features 260 may include metal lines and via features configured to couple the plurality of the resistors in series. Particularly, the second contact 260 of the first resistor is electrically connected to the first contact 258 of the second resistor. The second contact 260 of the second resistor is electrically connected to the first contact 258 of the third resistor, and so on (if more resistors are in series connection). Thus integrated resistor is a two terminal passive device. In this example, the first contact 258 of the first resistor serves as a first terminal and the second contact 260 of the third resistor serves as a second terminal.

Figure 15:
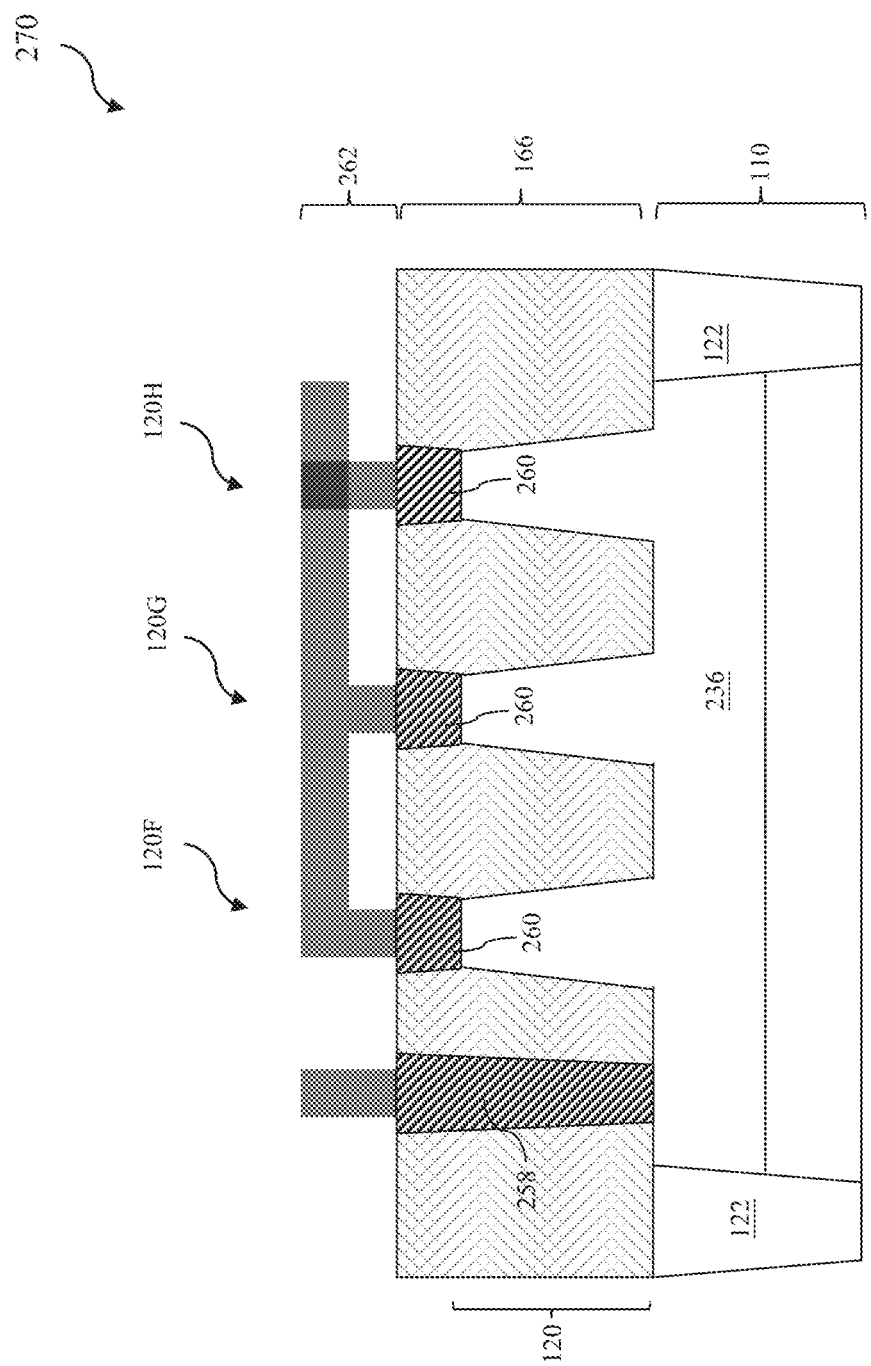
FIG. 15 is a sectional view of a semiconductor structure having a resistor constructed according to another embodiment.

FIG. 15 is a sectional view of a semiconductor structure 270 constructed according to another embodiment of the present disclosure. The semiconductor structure 270 includes a plurality of resistors connected in parallel. FIG. 15 only shows three resistors for illustration. Each resistor is formed in a semiconductor mesa.

The semiconductor structure 270 includes various STI features 122 formed in the semiconductor substrate 110, defining an active region. Multiple semiconductor mesas are formed on the semiconductor substrate 110 within the active region. In the present embodiment, exemplary three semiconductor mesas 120F, 120G and 120H are formed on the active region. multiple resistors are formed on the semiconductor mesas, respectively. In the present example, the semiconductor structure 250 includes a first resistor, a second resistor and a third resistor associated with the first, second and third semiconductor mesas (120F, 120GD and 120H), respectively.

Each resistor includes a doped feature 236 formed in the corresponding semiconductor mesa, extended to the semiconductor substrate 110. The doped features 236 are merged together in the semiconductor substrate 110. Each resistor has two terminals: a first contact 258 landing on the semiconductor substrate 110 as a common contact to the resistors in the active region; and a second contact 260 landing on the respective semiconductor mesa as a second terminal.

Accordingly, the three resistors are coupled together to form a two terminal passive device: the first contact 258 as a first terminal and the second contacts 260 electrically connected together through the conductive features 262 to form a second terminal.

Thus, the present disclosure provides one embodiment of a semiconductor structure. The semiconductor structure includes a semiconductor substrate having a first region and a second region; a first semiconductor mesa formed on the semiconductor substrate within the first region; a second semiconductor mesa formed on the semiconductor substrate within the second region; and a field effect transistor (FET) formed on the semiconductor substrate. The FET includes a first doped feature of a first conductivity type formed in a top portion of the first semiconductor mesa; a second doped feature of a second conductivity type formed in a bottom portion of the first semiconductor mesa, the second semiconductor mesa, and a portion of the semiconductor substrate between the first and second semiconductor mesas; a channel in a middle portion of the first semiconductor mesa and interposed between the source and drain; and a gate formed on sidewall of the first semiconductor mesa.

The present disclosure also provides another embodiment of a semiconductor resistor. The semiconductor resistor includes a semiconductor substrate having a first active region; a first semiconductor mesa formed on the semiconductor substrate within the first active region; a first resistor formed on the semiconductor substrate within the first active region; and a first contact and a second contact connected to two ends of to the first resistor, respectively. The first resistor includes a first doped feature formed on the first semiconductor mesa and extended to the semiconductor substrate within the first active region. The first contact lands on the semiconductor substrate and the second contact lands on the first semiconductor mesa.

The present disclosure also provides an embodiment of a method of forming a tunnel field effect transistor (TFET). The method includes forming a first semiconductor mesa and a second semiconductor mesa on a semiconductor substrate; performing a first implantation to form a drain of a first type conductivity, wherein the drain is a continuous doped feature extended from the first semiconductor mesa to the second semiconductor mesa through the semiconductor substrate; forming a first dielectric layer on the semiconductor substrate and sidewall of the first and second semiconductor mesas; forming a gate stack on the sidewall of the first semiconductor mesa and extending horizontally on the first dielectric layer; forming a second dielectric layer on the first dielectric layer and a horizontal portion of the gate stack; removing a portion of the gate stack uncovered by the second dielectric layer; and forming, on the first semiconductor mesa, a source having a second type conductivity opposite to the first type conductivity.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A device comprising:
   a first protrusion and a second protrusion disposed on a substrate;

a first source/drain feature including a first dopant disposed in the first protrusion;

a second source/drain feature including a second dopant disposed in the first protrusion, the substrate and the second protrusion, the second dopant being different than the first dopant, wherein the second source/drain feature is spaced apart from the first source/drain feature in the first protrusion;

a gate dielectric disposed along a sidewall of the first protrusion;

a gate electrode disposed on the gate dielectric along the sidewall of the first protrusion;

a pickup feature disposed in a top portion of the second protrusion, the pickup feature includes the second dopant at a greater concentration than the second source/drain feature.

2. The device of claim 1, further comprising a gate contact disposed on a portion of the gate electrode positioned between the first protrusion and the second protrusion, the portion of the gate electrode extending away from the first protrusion and extending towards the second protrusion and having a top surface facing away from the substrate, wherein the gate contact physically contacts the top surface of the portion of the gate electrode.

3. The device of claim 1, wherein the first dopant has a first conductivity type and the second dopant has a second conductivity type that is opposite the first conductivity type.

4. The device of claim 1, further comprising:
a third protrusion disposed on the substrate;
a doped feature disposed in the third protrusion and in the substrate; and
a first contact extending to the doped feature disposed in the substrate and a second contact extending to the doped feature disposed in the third protrusion.

5. The device of claim 1, wherein the first protrusion includes an undoped portion disposed between the first source/drain feature and the second source/drain feature in the first protrusion.

6. A device comprising:
a first mesa extending from a substrate;
a first source/drain feature disposed in the first mesa, the first source/drain feature having a first dopant;
a second source/drain feature disposed in the first mesa and extending into the substrate, the second source/drain feature having a second dopant at a first concertation, the second dopant formed of a different material than the first dopant;
a channel region disposed in the first mesa between the first and second source/drain features, the channel region including the second dopant at a second concentration that is different than the first concentration;
a gate structure disposed on the first protrusion; and
a pickup feature interfacing with the second source/drain feature, the pickup feature including the second dopant at a third concentration that is different than the first concentration.

7. The device of claim 6, wherein the third concentration is greater than either of the first and second concentrations.

8. The device of claim 6, further comprising:
a first contact feature interfacing with the first source/drain feature;

a second contact feature interfacing with the gate structure, and
a third contact feature interfacing with the pickup feature.

9. The device of claim 6, wherein the first mesa has a first sidewall, a second sidewall and a top surface extending from the first sidewall to the second sidewall, and
wherein the top surface of the first mesa is free of the gate structure.

10. The device of claim 9, wherein the gate structure includes a gate dielectric layer and gate electrode layer, and
wherein the gate dielectric layer extends along the first sidewall and the second sidewall and the gate electrode layer is disposed on the gate dielectric layer extending along the first sidewall and the second sidewall.

11. The device of claim 9, wherein the gate structure includes a gate dielectric layer and gate electrode layer, and
wherein the gate dielectric layer interfaces with the first source/drain feature, the channel region and the second source/drain feature.

12. The device of claim 9, wherein the first sidewall of the of the first mesa has a tapered profile extending from top surface of the substrate to the top surface of the first mesa.

13. A device comprising:
a first protrusion extending from a substrate;
a first source/drain feature disposed in the first protrusion;
a second source/drain feature disposed in the first protrusion and extending into the substrate, the second source/drain feature including a first dopant at a first concentration;
a gate structure disposed on the first protrusion; and
a pickup feature interfacing with the second source/drain feature, the pickup feature including the first dopant at a second concentration that is different than the first concentration.

14. The device of claim 13, wherein the second concentration is greater than the first concentration.

15. The device of claim 13, wherein the first protrusion has a trapezoidal cross-sectional profile.

16. The device of claim 13, further comprising an interlayer dielectric layer disposed on the first protrusion such that a portion of the interlayer dielectric layer interfaces with the first source/drain feature.

17. The device of claim 13, further comprising a second protrusion extending form the substrate, and
wherein the pickup feature is disposed in the second protrusion.

18. The device of claim 17, wherein the second source/drain feature further extends into the second protrusion.

19. The device of claim 13, further comprising:
a second protrusion extending from the substrate;
a dielectric isolation structure disposed in the substrate between the first and second protrusions;
a doped feature disposed in the second protrusion and extending into the substrate;
a first contact electrically coupled to a first portion of the doped feature disposed in the substrate; and
a second contact electrically coupled to a second portion of the doped feature disposed in the second protrusion.

20. The device of claim 19, wherein the second source/drain feature and the doped feature interface with the dielectric isolation structure.

* * * * *